(12) United States Patent
Kim

(10) Patent No.: US 10,094,869 B2
(45) Date of Patent: Oct. 9, 2018

(54) REPAIRABLE SEMICONDUCTOR MEMORY DEVICE AND TEST METHODS FOR THE SAME

(71) Applicant: SK hynix Inc., Icheon-si, Gyeonggi-do (KR)

(72) Inventor: Sang Hee Kim, Incheon (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/650,451

(22) Filed: Jul. 14, 2017

(65) Prior Publication Data

US 2018/0261301 A1 Sep. 13, 2018

(30) Foreign Application Priority Data

Mar. 13, 2017 (KR) .................. 10 2017 0031250

(51) Int. Cl.
| | |
|---|---|
| *G01R 31/28* | (2006.01) |
| *G11C 29/44* | (2006.01) |
| *G11C 29/20* | (2006.01) |
| *G11C 29/00* | (2006.01) |
| *G11C 29/24* | (2006.01) |
| *G11C 29/30* | (2006.01) |
| *G11C 17/16* | (2006.01) |

(52) U.S. Cl.
CPC ............. *G01R 31/28* (2013.01); *G11C 17/16* (2013.01); *G11C 29/00* (2013.01); *G11C 29/20* (2013.01); *G11C 29/24* (2013.01); *G11C 29/30* (2013.01); *G11C 29/4401* (2013.01); *G11C 29/78* (2013.01); *G11C 2029/4402* (2013.01)

(58) Field of Classification Search
CPC ..... G11C 29/4401; G11C 17/16; G11C 29/30; G11C 29/78; G11C 29/20; G11C 29/24; G11C 2029/4402
See application file for complete search history.

(56) References Cited

U.S. PATENT DOCUMENTS

| | | | | |
|---|---|---|---|---|
| 5,987,632 | A * | 11/1999 | Irrinki | G11C 29/44 365/201 |
| 6,539,506 | B1 * | 3/2003 | Lammers | G11C 29/44 714/704 |
| 7,260,758 | B1 * | 8/2007 | Agrawal | G11C 29/56 714/733 |
| 9,401,219 | B2 | 7/2016 | Shim | |
| 2015/0155055 | A1 | 6/2015 | Kim et al. | |
| 2016/0351276 | A1 * | 12/2016 | Shim | G11C 29/78 |

\* cited by examiner

*Primary Examiner* — Ajay Ojha
(74) *Attorney, Agent, or Firm* — William Park & Associates Ltd.

(57) ABSTRACT

A repair device and a semiconductor device including the same are disclosed, which relate to a technology for storing failure information in a fuse circuit during a test operation. The repair device includes a test circuit configured to test data received from a cell array in response to a test signal, and output a failure signal when a failure occurs. The repair device also includes a count circuit configured to output a counting signal by counting the failure signal, a column failure decision circuit configured to determine whether a column failure occurs in response to the counting signal, and output a write enable signal. Further, the repair device includes a fuse controller configured to output a failed column address in response to the counting signal when the write enable signal is activated, and a column fuse circuit configured to sequentially store the column address.

20 Claims, 4 Drawing Sheets

REPAIRABLE SEMICONDUCTOR MEMORY DEVICE AND TEST METHODS FOR THE SAME

CROSS-REFERENCE TO RELATED APPLICATION

This application claims priority based upon Korean patent application No. 10-2017-0031250, filed on Mar. 13, 2017, the disclosure of which is hereby incorporated by reference in its entirety herein.

BACKGROUND OF THE INVENTION

1. Technical Field

Embodiments of the present disclosure may generally relate to a repair device and a semiconductor device including the same, and more particularly to a technology for storing failure information in a fuse circuit during a test operation.

2. Background Art

A semiconductor memory device is constructed of a plurality of memory cells which are arranged in the form of a matrix. However, if a defective or failed cell occurs in at least one memory cell from among a plurality of memory cells, it is impossible for a semiconductor memory device to normally operate, so that the semiconductor memory device having the defective cell is regarded as a defective product and abandoned. As the semiconductor memory device has been developed to have a higher degree of integration at a higher speed, there is a higher possibility of causing defective cells. Provided that the entirety of the semiconductor memory device is discarded due to a defect generated in only a few memory cells among all memory cells contained in the semiconductor memory device, the discarding of the entirety of the semiconductor memory device is cost ineffective and is far from high product efficiency.

As a result, a production yield denoted by the ratio of a total number of produced chips to the number of normal chips, which is needed for deciding production costs of semiconductor memory devices, is gradually reduced. Therefore, in order to increase a production yield of semiconductor memory devices, many developers and companies are conducting intensive research into a method for constructing highly-integrated semiconductor memory devices configured to operate at a higher speed and a method for efficiently repairing defective cells.

As an exemplary method for repairing the defective cell, a technology for embedding a repair circuit configured to replace a defective cell with a redundancy cell, into the semiconductor memory device has been widely used. Generally, the repair circuit includes redundancy columns/rows in which redundancy memory cells are arranged in rows and columns.

The repair circuit selects the redundancy column/row to substitute for the defective column/row. That is, if a row and/or column address signal for designating a defective cell is input to the repair circuit, the repair circuit selects the redundancy column/row instead of the defective column/row of a memory cell bank.

In order to recognize an address for designating a defective cell, the semiconductor memory device includes a plurality of fuses capable of being blown, and the fuses are selectively blown so that an address of the defective cell can be programmed.

BRIEF SUMMARY OF THE INVENTION

Various embodiments of the present disclosure are directed to providing a repair device and a semiconductor device including the same that substantially obviate one or more problems due to limitations and disadvantages of the related art.

The embodiment of the present disclosure relates to a technology for storing failure information in a fuse circuit contained in a semiconductor device during a test operation, and performing the repair operation in response to internal fuse information, resulting in reduction of a test time.

In accordance with an embodiment of the present disclosure, a repair device includes: a test circuit configured to test data received from a cell array in response to a test signal, and output a failure signal when a failure occurs; a count circuit configured to output a counting signal by counting the failure signal; a column failure decision circuit configured to determine whether a column failure occurs in response to the counting signal, and output a write enable signal; a fuse controller configured to output a failed column address in response to the counting signal when the write enable signal is activated; and a column fuse circuit configured to sequentially store the column address.

In accordance with another embodiment of the present disclosure, a semiconductor device includes: a cell array configured to output cell data; a column decoder configured to decode the cell data, and thus output decoding data; a test circuit configured to test the decoding data in response to a test signal, and output a failure signal when a failure occurs; a count circuit configured to output a counting signal by counting the failure signal; a column failure decision circuit configured to determine whether a column failure occurs in response to the counting signal, and output a write enable signal; a fuse controller configured to output a failed column address in response to the counting signal when the write enable signal is activated; and a column fuse circuit configured to sequentially store the column address.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions.

The operation for repairing one or more defective cells of the semiconductor memory device may be classified into a first repair operation performed in a wafer state and a second repair operation performed in a package state.

The semiconductor memory device includes a fuse circuit capable of programming an address corresponding to a repair target memory cell indicating a defective cell. In this case, the programming operation may refer to an operation for storing address information corresponding to the repair target memory cell to store repair address information in a redundancy memory cell instead of the repair target memory cell.

If an attempt to access the repair target memory cell is received from the external part by the repair operation, the redundancy memory cell can be accessed by referring to the programmed repair address.

Figure 1:
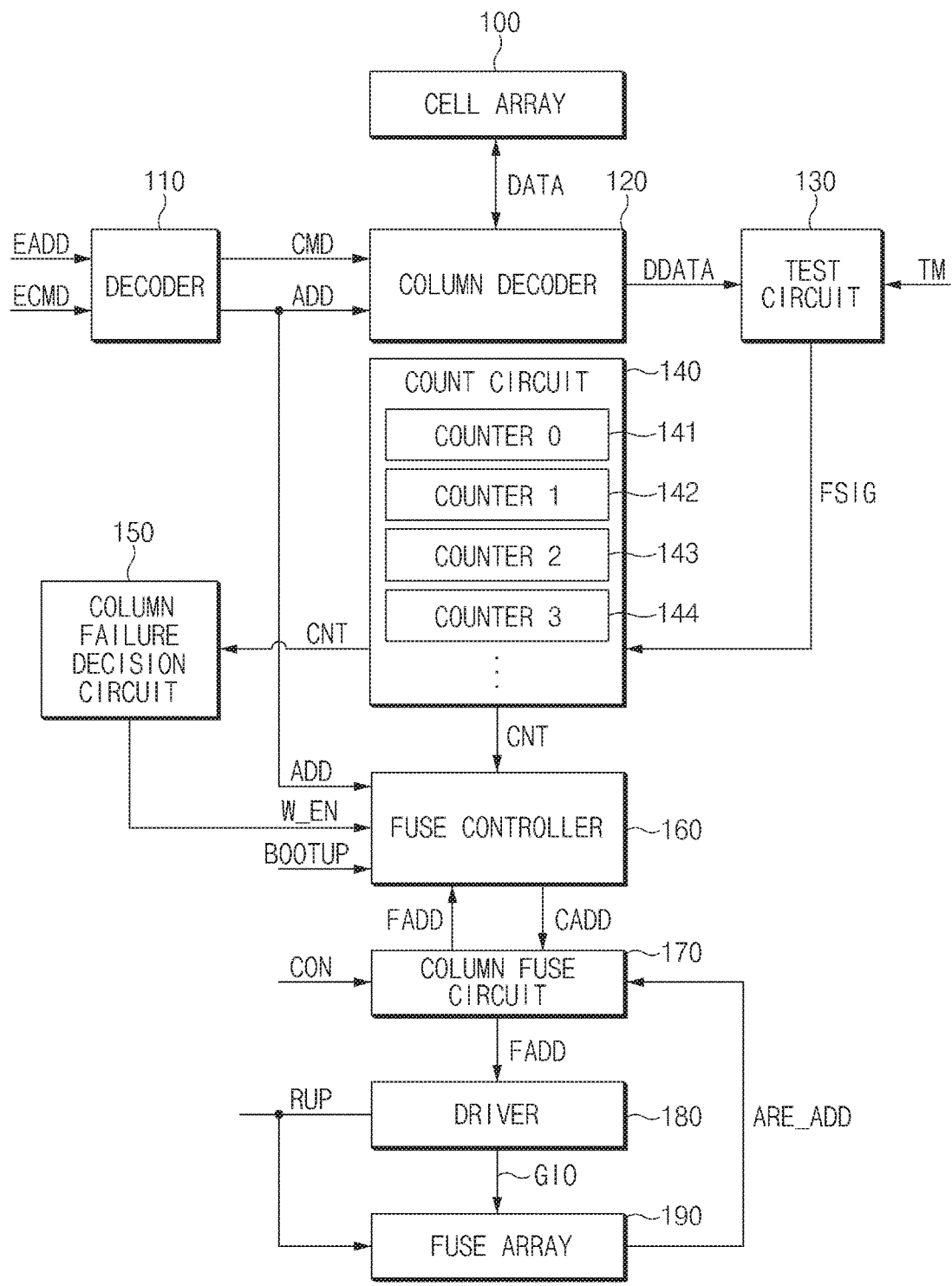
FIG. 1 is a block diagram illustrating a representation of an example of a semiconductor device according to an embodiment of the present disclosure.

FIG. 1 is a block diagram illustrating a representation of an example of a semiconductor device according to an embodiment of the present disclosure.

Referring to FIG. 1, the semiconductor device may include a cell array 100, a decoder 110, a column decoder 120, a test circuit 130, a count circuit 140, a column failure decision circuit 150, a fuse controller 160, a column fuse circuit 170, a driver 180, and a fuse array 190.

The decoder 110 may receive an external command signal ECMD and an external address EADD, may decode the received external command signal ECMD and the received external address EADD, and may output a command signal CMD and an address ADD. In this case, the command signal CMD may include an active signal, a read signal, etc. The address ADD may include column address information to be used as a repair target.

Upon receiving the command signal CMD, the column decoder 120 may decode the address ADD and select a column line of the cell array 100. In addition, the column decoder 120 may decode data DATA received from the cell array 100, and may output decoding data DDATA to the test circuit 130.

The test circuit 130 may test data DATA received from the cell array 100 via the column decoder 120 as decoding data DDATA in response to a test signal TM, and may thus output a failure signal FSIG when a failure in testing the decoding data DDATA occurs. For example, during activation of the test signal TM, the test circuit 130 may compress the decoding data DDATA, and may perform testing. That is, the test circuit 130 may perform a parallel test capable of simultaneously testing a plurality of cells to increase productivity.

The test circuit 130 may determine the presence or absence of failure data in compressed data. If the presence of failure data is determined, the test circuit 130 may activate the failure signal FSIG. That is, the test circuit 130 may re-read data that was previously read from the cell array 100 and if the read data is the same as the re-read data, the test circuit 130 may determine the occurrence of a pass state. In contrast, the test circuit 130 may re-read data that was previously read the cell array 100 and if the read data is different from the re-read data, the test circuit 130 may determine the occurrence of a failure state. If a failure state is determined, the test circuit 130 may test all cells contained in the cell array 100.

The count circuit 140 may output a counting signal CNT by counting the failure signal FSIG. The count circuit 140 may include a plurality of counters 141~144 each including N bits. The plurality of counters 141~144 may include a predetermined number of counters which correspond to a column size of the cell array 100. The plurality of counters 141~144 may be counters, each of which can count N bits.

The count circuit 140 may sequentially activate the plurality of counters 141~144 when the failure signal FSIG is activated. In other words, when the failure signal FSIG is first activated, the first counter 141 may perform the up-counting operation. If the failure signal FSIG is activated a second time, the second counter 142 may perform the up-counting operation.

In this case, the number of counters 141~144 may be identical to the number of column decoders 120. For example, assuming that four column decoders 120 are used, four counters 141~144 may be used. That is, the plurality of counters 141~144 may be matched to the column decoders 120 on a one to one basis, and the number of counters 141~144 may be established in consideration of a column size of the column decoder 120. Thus, the number of counters 141~144 may correspond to the column size of the cell array 100.

The column failure decision circuit 150 may determine a value of the counting signal CNT received from the count circuit 140, and may determine whether a failure state is a row failure or a column failure according to the determined result of the counting signal CNT. For example, the column failure decision circuit 150 may pre-store information regarding the column size of the cell array 100. If the count of the counting signal CNT is equal to or greater than a predetermined column size, the column failure decision circuit 150 may determine the occurrence of a column failure, and may thus activate and output a write enable signal.

The fuse controller 160 may store a column address CADD in the column fuse circuit 170 in response to a boot-up signal BOOTUP, a write enable signal W_EN, an address ADD, a counting signal CNT, and a fuse address FADD.

In other words, the fuse controller 160 may read the fuse address FADD received from the column fuse circuit 170 during activation of the boot-up signal BOOTUP, such that the fuse controller 160 may determine whether a fuse of the column fuse circuit 170 is used. The fuse controller 160 may output the column address CADD having a failed part in response to the counting signal CNT to the column fuse circuit 170 during activation of the write enable signal W_EN. In this case, the fuse controller 160 may compare a repair target address, i.e. the address ADD, with the fuse address FADD when the counting signal CNT is activated and the write signal W_EN is activated. If the repair target address is identical to the fuse address FADD, the fuse controller 160 may output the column address CADD to be stored in the column fuse circuit 170.

The column fuse circuit 170 may store the column address CADD received from the fuse controller 160 in the corresponding fuse set. The column fuse circuit 170 may include a plurality of column fuse sets, and may sequentially store the column address CADD in the plurality of column fuse sets. The plurality of column fuse sets will hereinafter be described with reference to FIG. 2.

The column fuse circuit 170 may store failure information of an E-fuse address ARE_ADD received from the fuse array 190 in response to a control signal CON. In this case, the control signal CON may be activated in response to a rupture signal RUP for controlling a rupture operation of the fuse.

The column fuse circuit 170 may output the stored fuse address FADD to the fuse controller 160 when the control signal CON is activated, where the fuse address FADD indicates whether each fuse set is used. That is, the column fuse circuit 170 may output the fuse address FADD corresponding to the E-fuse address ARE_ADD to the fuse controller 160. In this case, if the E-fuse address ARE_ADD indicating whether the fuse of the column fuse circuit 170 is used is not stored in the fuse set, the absence of a used fuse is determined. In contrast, if the E-fuse address ARE_ADD is stored in the fuse set, the presence of a used fuse is determined such that the corresponding fuse set is not used.

A basic repair sequence for use in the wafer test is as follows. The test device (i.e., the external test device) located outside the semiconductor device may extract failure information after completion of a test, may construct the extracted failure information, and may convert the constructed failure information into a failure address. The test device may perform calculation to replace the failure address using a minimum number of fuses, may re-load replacement information of the failure address in the semiconductor device, and may perform the repair operation. All the test operations may be achieved in the external test device of the semiconductor device.

In this case, there is no continuity of the test operation and the test procedure is complicated, resulting in an increased test time. As a result, an embodiment of the present disclosure which does not output pass or failure information of the failure address to the external test device, may store failure information in the column fuse circuit 170 contained in the semiconductor device, and may perform the repair operation based on the stored failure information, such that the test operation is simplified and the test time is reduced.

When the rupture signal RUP is activated, the driver 180 may drive the fuse address FADD received from the column fuse circuit 170, and may output the driven fuse address FADD to the fuse array 190 through a global input/output (I/O) line GIO.

The fuse array 190 may receive and store an address transmitted from the driver 180 via global I/O line GIO in a fuse in response to the rupture signal RUP. The fuse array 190 may output an E-fuse address to the column fuse circuit 170 during activation of the rupture signal RUP. The fuse array 190 may program the failure address by rupturing the corresponding array E-fuse (ARE). The fuse array 190 may include a plurality of E-fuses, and may access the redundancy memory cell contained in a redundancy region of the cell array 100 in response to a fuse signal contained in the E-fuse.

If a specific value determined by a test of the semiconductor integrated circuit (IC) needs to be set, the fuse circuit is used. A general fuse circuit may use a laser fuse configured in the form of a metal line, and may program the fuse by selectively blowing the metal line using a laser beam. That is, desired information may be supplied to the semiconductor integrated circuit (IC) according to whether the fuse is blown. However, the laser fuse circuit requires continuous equipment investment caused by reduction of an inter-line pitch according to higher integration of the semiconductor integrated circuit (IC), and also consumes a long period of time to perform fuse programming. In addition, the region occupied by the fuse array in the laser fuse circuit is relatively large in size, it is possible to program the laser fuse circuit at only a wafer level, and it is impossible to program the laser fuse circuit at a package level.

In recent times, E-fuses have been widely used to substitute for such laser fuses. The E-fuses have been highlighted as an alternative capable of overcoming drawbacks of the above-mentioned laser fuses. In order to program each E-fuse, the E-fuse is basically configured in the form of a transistor, and a high electric field is supplied to a gate terminal of the transistor such that a gate insulation film is ruptured.

Although the fuse array 190 may be implemented in various ways, the array E-fuse (ARE) circuit in which unit fuse cells are arranged in the form of an array is used. When the semiconductor integrated circuit (IC) is initialized (or powered up), data programmed in the fuse array 190 is read, and the read data is then stored in a register. The repair operation is performed using the data stored in the register.

In this case, an operation for storing the programmed fuse data in the register is referred to as a boot-up operation. During the initialization operation, the boot-up operation can be initiated using the reset signal received from the external part.

Meanwhile, the cell array 100 may further include a normal memory cell and a redundancy memory cell. That is, a redundancy circuit may be used. In more detail, if a defect or failure occurs in a cell, the redundancy circuit may pre-recognize the defect or failure of the cell through a test, such that a cell contained in the redundancy circuit instead of the defective cell can be accessed when a request for accessing the corresponding cell occurs. In this case, the redundancy circuit may refer to a set (or aggregate) of redundant memory cells additionally contained in the memory, such that the redundant memory cell(s) may be used as substitute cell(s) of the defective cell(s). The redundancy memory cell is a circuit for repairing a defective memory cell (hereinafter referred to as a repair target memory cell) when a defect or failure occurs in a normal memory cell.

In more detail, when the repair target memory cell is accessed during a read or write operation, a normal memory cell instead of the repair target memory cell is accessed. In this case, the accessed memory cell is a redundancy memory cell.

Therefore, if an address corresponding to the repair target memory cell is input to the semiconductor memory device, the operation (hereinafter referred to as a repair operation) for accessing the redundancy memory cell instead of the repair target memory cell is performed.

Figure 2:
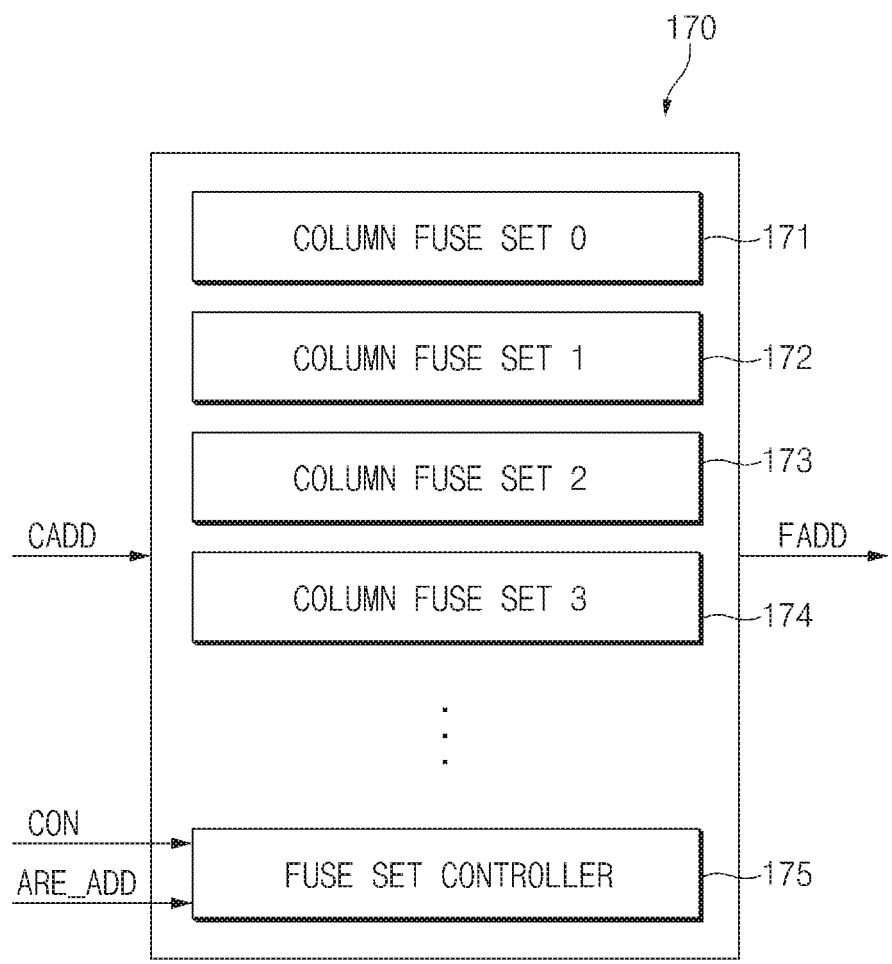
FIG. 2 is a detailed circuit diagram illustrating a representation of an example of a column fuse circuit shown in FIG. 1.

FIG. 2 is a detailed circuit diagram illustrating the column fuse circuit 170 shown in FIG. 1.

Referring to FIG. 2, the column fuse circuit 170 may include a plurality of column fuse sets 171~174 and a fuse set controller 175. The embodiment of the present disclosure has exemplarily disclosed that the number of column fuse sets 171~174 is matched to the number of counters 141~144 of the count circuit 140. The number of drivers 180 may be identical to the number of column fuse sets 171~174.

For example, assuming that the number of counters 141~144 is set to 4, four column fuse sets 171~174 may be used. Therefore, in the column fuse circuit 170, a column address CADD corresponding to one of the respective counters 141~144 may be sequentially stored in the corresponding column fuse sets 171~174 of the column fuse circuit 170.

That is, the column address CADD generated in response to the counting signal CNT of the first counter 141 may be stored in the first column fuse set 171. The column address CADD generated in response to the counting signal CNT of the second counter 142 may be stored in a second column fuse set 182, etc.

The row and column size of the cell array 100 may be 4×4. The first column line is activated four times whenever four row lines are sequentially activated, such that the first counter 141 may output the counting signal CNT denoted by "4". In other words, assuming that a defect or failure also occurs in the same column line, the counting value is continuously increased.

If the column size is denoted by "4", only one counter 141 may count 2 bits through only one test operation. In more detail, only one counter 141 may perform four counting actions corresponding to the number of columns during only one test operation. As a result, the fuse controller 160 may determine the presence of a defect or failure in the first column according to the value of the counting signal CNT. Therefore, the fuse set controller 175 may store a defective or failed column address CADD in the column fuse set 171 corresponding to the first counter 141.

Thereafter, in order to determine the presence or absence of a defect or failure in the second column, the next counter 142 may perform the counting operation. The above-mentioned counting operation may be sequentially carried out by all the counters 141~144.

When the control signal CON is activated, the fuse set controller 175 may receive the E-fuse address ARE_ADD having a defective or failed part from the fuse array 190, and may sequentially store the received E-fuse address ARE_ADD in the plurality of column fuse sets 171~174. The fuse set controller 175 may output the fuse address FADD stored in the plurality of column fuse sets 171~174 to the fuse controller 160 in response to the control signal CON.

In this case, if the E-fuse address ARE_ADD is stored in some column fuse sets (e.g., the column fuse set 171) from among the plurality of column fuse sets 171~174, the column fuse set 171 may refer to fuse set that has already been used. Therefore, during the re-bootup operation, the fuse set controller 175 may sequentially increment the column address CADD to the remaining unused column fuse sets 172~174 other than the previously-used column fuse set 171.

Figure 3:
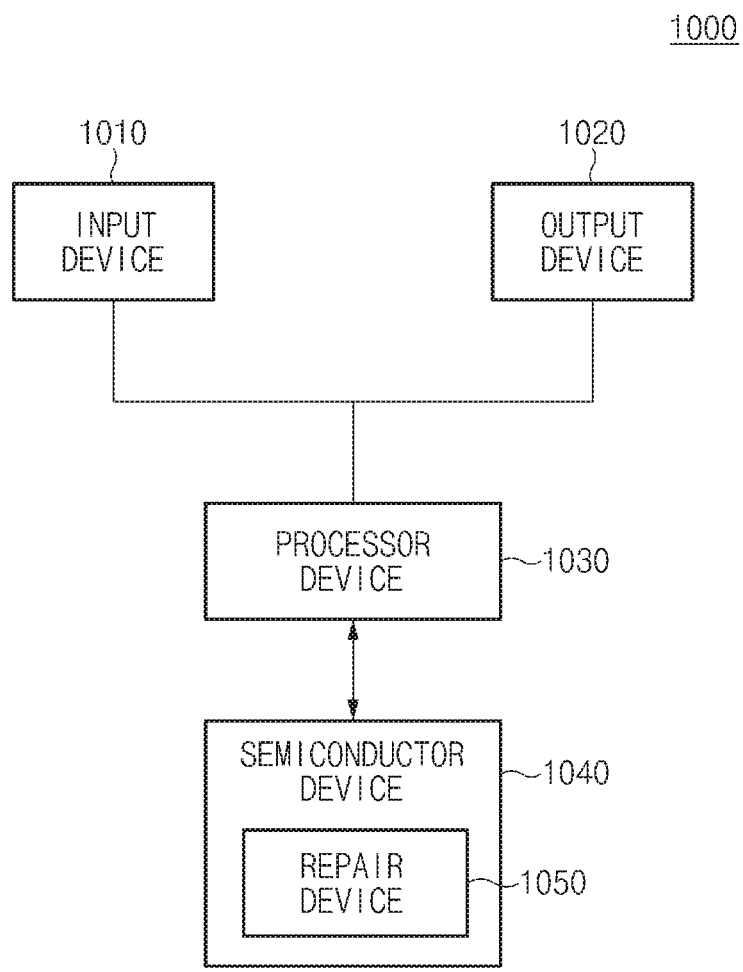
FIG. 3 is a block diagram illustrating a representation of an application example of an electronic system including a repair device according to an embodiment of the present disclosure.

FIG. 3 is a block diagram illustrating an application example of an electronic system including the repair device according to the embodiment of the present disclosure.

Referring to FIG. 3, the electronic system 1000 may include an input device 1010, an output device 1020, a processor device 1030, and a semiconductor device 1040. In this case, the processor device 1030 may control the input device 1010, the output device 1020, and the semiconductor device 1040 through the corresponding interfaces.

The processor device 1030 may include at least any one of at least one microprocessor, at least one digital signal processor, at least one microcontroller, and logic circuits capable of performing the same or similar functions as these components.

The input device 1010 may include at least one selected among a keyboard, a mouse, a keypad, a touchscreen, a scanner, and so forth. The output device 1020 may include at least one selected among a monitor, a speaker, a printer, a display device, and so forth. The semiconductor device 1040 may include the repair device 1050 described in the aforementioned embodiment.

Figure 4:
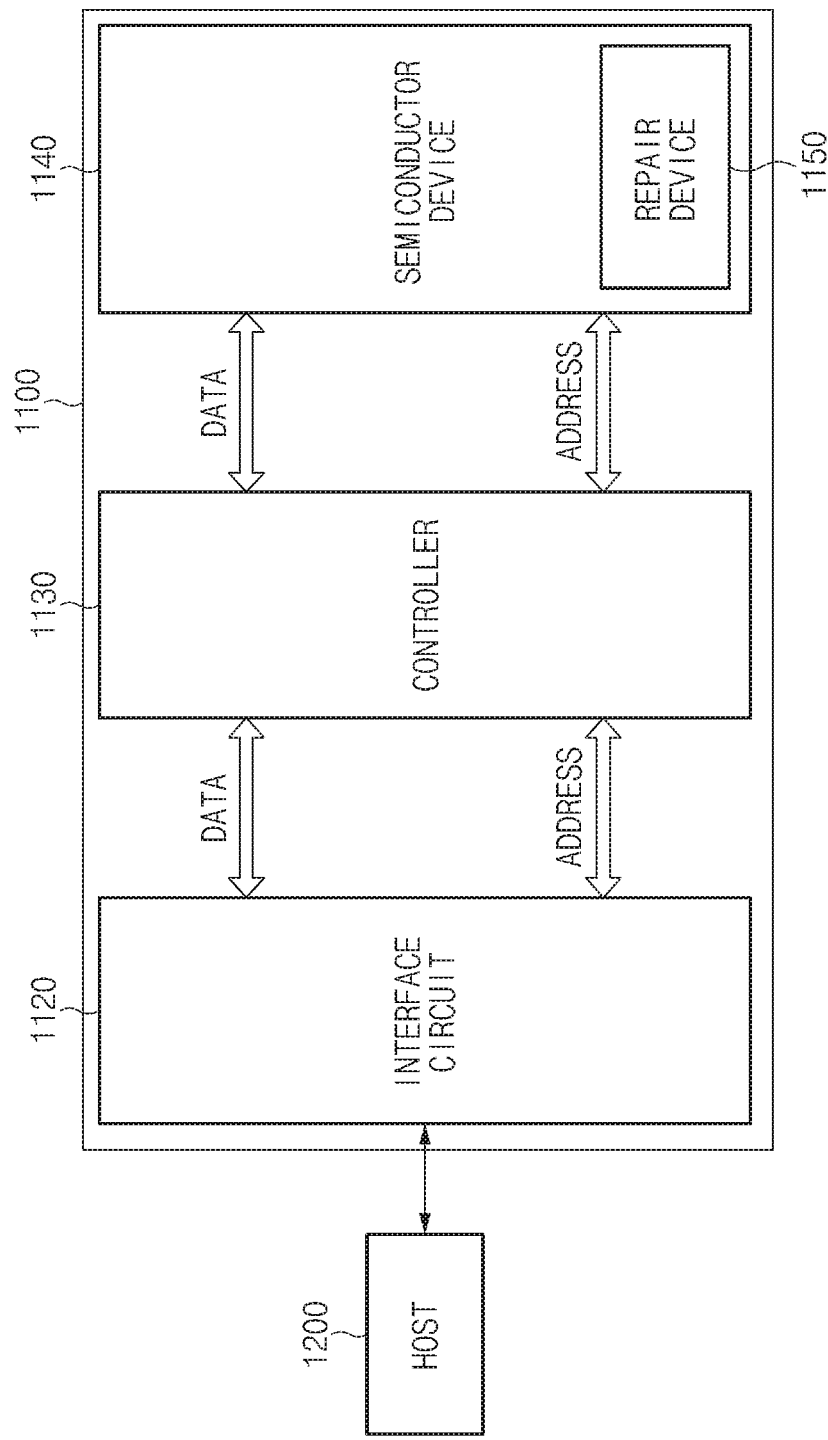
FIG. 4 is a block diagram illustrating a representation of an example of a memory system based on the semiconductor device according to an embodiment of the present disclosure.

FIG. 4 is a block diagram illustrating a representation of an example of a memory system using the semiconductor device according to the embodiment of the present disclosure.

Referring to FIG. 4, the memory system 1100 may include a semiconductor device 1140, an interface circuit 1120, and a controller 1130.

The interface circuit 1120 may provide interfacing between the memory system 1110 and the host 1200. The interface circuit 1120 may include a data exchange protocol corresponding to the host 1200 so as to interface with the host 1200.

The interface circuit 1120 may be configured to communicate with the host 1200 through one of various interface protocols, for example, a Universal Serial Bus (USB) protocol, a Multimedia Card (MMC) protocol, a Peripheral Component Interconnect-Express (PCI-E) protocol, a Serial Attached SCSI (SAS) protocol, a Serial Advanced Technology Attachment (SATA) protocol, a Parallel Advanced Technology Attachment (PATA) protocol, a Small Computer System Interface (SCSI) protocol, an Enhanced Small Disk Interface (ESDI), and an Integrated Drive Electronics (IDE) protocol.

The controller 1130 may receive data and an address from an external part through the interface circuit 1120. The controller 1130 may access the semiconductor device 1140 by referring to data and address received from the host 1200. The controller 1130 may transfer data read from the semiconductor device 1140 to the host 1200 through the interface circuit 1120.

The semiconductor device 1140 may include the repair device 1150 illustrated in FIG. 2. The semiconductor device 1140 may be used as a storage medium of the memory system 1100.

The memory system 1100 illustrated in FIG. 4 may be mounted to information processing devices, for example, a personal digital assistant (PDA), a portable computer, a web tablet, a digital camera, a portable media player (PMP), a mobile phone, a wireless phone, a laptop computer, etc. The memory system 1100 may be any of a multimedia card (MMC), a Secure Digital (SD) card, a micro SD card, a memory stick, an ID card, a Personal Computer Memory Card International Association (PCMCIA) card, a chip card, a USB card, a smart card, a Compact Flash (CF) Card, etc.

As is apparent from the above description, the repair device according to the embodiments of the present disclosure can reduce a test time by storing failure information in a fuse circuit contained in the semiconductor device during a test operation, resulting in increased test efficiency.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A repair device comprising:
    a test circuit configured to test data received from a cell array in response to a test signal, and output a failure signal when a failure occurs;
    a count circuit configured to output a counting signal by counting the failure signal;
    a column failure decision circuit configured to determine whether a column failure occurs in response to the counting signal, and output a write enable signal;
    a fuse controller configured to output a failed column address in response to the counting signal when the write enable signal is activated; and
    a column fuse circuit configured to sequentially store the column address,
    wherein the test circuit re-reads data written in the cell array, and activates the failure signal when the re-read data is different from read data.

2. The repair device according to claim 1, wherein the count circuit includes a plurality of counters, each of which includes N bits.

3. The repair device according to claim 2, wherein the plurality of counters are sequentially activated.

4. The repair device according to claim 2, wherein the number of the plurality of counters corresponds to a column size of the cell array.

5. The repair device according to claim 1, wherein the column failure decision circuit activates the write enable signal when the number of the counting signals is equal to or higher than a specific number.

6. The repair device according to claim 1, wherein:
    if the counting signal is activated in an activation state of the write enable signal, the fuse controller compares a fuse address with a repair target address, and outputs a column address when the fuse address is identical to the repair target address.

7. The repair device according to claim 1, wherein the fuse controller receives a fuse address during a boot-up operation, and determines if a fuse of the column fuse circuit is used.

8. The repair device according to claim 1, wherein the column fuse circuit outputs a fuse address to the fuse controller when a control signal is activated, where the fuse address indicates whether each fuse set is used.

9. The repair device according to claim 1, wherein the column fuse circuit includes a plurality of column fuse sets configured to sequentially store the column address.

10. The repair device according to claim 9, wherein the plurality of column fuse sets are identical to the number of counters contained in the count circuit.

11. The repair device according to claim 9, wherein the column fuse circuit further includes:
    a fuse set controller configured to sequentially store a fuse address having a failure in the plurality of column fuse sets during activation of a control signal.

12. The repair device according to claim 11, wherein the fuse set controller outputs the fuse address stored in the plurality of column fuse sets to the fuse controller in response to the control signal.

13. The repair device according to claim 1, further comprising:
    a driver configured to output a fuse address received from the column fuse circuit to a global input/output (I/O) line when a rupture signal is activated.

14. The repair device according to claim 13, wherein the number of the drivers corresponds to the number of column fuse sets contained in the column fuse circuit.

15. The repair device according to claim 13, further comprising:
    a fuse array configured to store an address received from the driver in an E-fuse, and output an E-fuse address to the column fuse circuit during activation of a rupture signal.

16. The repair device according to claim 1, further comprising:
    a decoder configured to output an internal address and a command signal by decoding an external address and an external command signal.

17. The repair device according to claim 1, further comprising:
    a column decoder configured to decode data of the cell array, and thus output decoding data to the test circuit.

18. A semiconductor device comprising:
    a cell array configured to output cell data;
    a column decoder configured to decode the cell data, and output decoding data;
    a test circuit configured to test the decoding data in response to a test signal, and output a failure signal when a failure occurs;
    a count circuit configured to output a counting signal by counting the failure signal;
    a column failure decision circuit configured to determine whether a column failure occurs in response to the counting signal, and output a write enable signal;
    a fuse controller configured to output a failed column address in response to the counting signal when the write enable signal is activated; and
    a column fuse circuit configured to sequentially store the column address,
    wherein the test circuit re-reads data written in the cell array, and activates the failure signal when the re-read data is different from read data.

19. The semiconductor device according to claim 18, wherein:
    the count circuit includes a predetermined number of counters corresponding to a column size of the cell array; and
    the column fuse circuit includes a predetermined number of column fuse sets corresponding to the number of the counters.

20. The semiconductor device according to claim 18, wherein a plurality of counters included the count circuit are sequentially activated.

* * * * *